(12) United States Patent
Armstrong et al.

(10) Patent No.: US 10,267,675 B2
(45) Date of Patent: Apr. 23, 2019

(54) MULTI-DIRECTIONAL OPTICAL RECEIVER

(71) Applicant: Jean Armstrong, Victoria (AU)

(72) Inventors: Jean Armstrong, North Balwyn (AU); Qian Wang, St. Ives (AU); Cuiwei He, Notting Hill (AU)

(73) Assignee: Monash University, Victoria (AU)

( * ) Notice: Subject to any disclaimer, the term of this patent is extended or adjusted under 35 U.S.C. 154(b) by 60 days.

(21) Appl. No.: 15/532,790

(22) PCT Filed: Dec. 4, 2015

(86) PCT No.: PCT/AU2015/050769
§ 371 (c)(1),
(2) Date: Jun. 2, 2017

(87) PCT Pub. No.: WO2016/086276
PCT Pub. Date: Jun. 9, 2016

(65) Prior Publication Data
US 2017/0363462 A1 Dec. 21, 2017

(30) Foreign Application Priority Data
Dec. 5, 2014 (AU) .............................. 2014904921

(51) Int. Cl.
*G01J 1/00* (2006.01)
*G01J 1/02* (2006.01)
(Continued)

(52) U.S. Cl.
CPC .......... *G01J 1/0266* (2013.01); *G01J 1/0242* (2013.01); *G01J 1/04* (2013.01); *G01J 1/0437* (2013.01);
(Continued)

(58) Field of Classification Search
CPC .......... G01J 1/0242; G01J 1/0266; G01J 1/04; G01J 1/06; G01J 2001/067
(Continued)

(56) References Cited

U.S. PATENT DOCUMENTS 4,946,277 A * 8/1990 Marquet ................. G01S 3/783
250/203.1
5,319,188 A * 6/1994 Cole ....................... F41G 7/226
250/203.4
(Continued)

OTHER PUBLICATIONS

International Application Serial No. PCT/AU2015/050769, International Preliminary Report on Patentability dated Jun. 15, 2017, 9 pgs.
(Continued)

*Primary Examiner* — Kevin K Pyo
(74) *Attorney, Agent, or Firm* — Schwegman Lundberg & Woessner, P.A.

(57) ABSTRACT

An optical receiver (100) for detection of light from one or more sources (108) comprises an opaque layer (102) disposed on a first surface. An aperture (104) is formed in the opaque layer. An optical detector (106) has a detection region disposed on a second surface. The first and second surfaces are spaced apart from one another such that light passing through the aperture (104) illuminates a corresponding illumination region (110) on the second surface, and is detected by the optical detector (106) In the event that the detection region overlaps the illumination region. Multiple apertures may be formed in the opaque layer, and/or multiple optical detectors may be disposed on the second surface. The optical receiver may thereby enable optical signals originating at different locations to be detected, and distinguished, over a wide field of view.

15 Claims, 3 Drawing Sheets

(51) Int. Cl.
*G01J 1/04* (2006.01)
*H04B 10/114* (2013.01)
*G01S 3/00* (2006.01)
*H01L 31/08* (2006.01)
*G01S 3/784* (2006.01)

(52) U.S. Cl.
CPC ............... *G01S 3/00* (2013.01); *G01S 3/784* (2013.01); *H01L 31/08* (2013.01); *H04B 10/114* (2013.01)

(58) Field of Classification Search
USPC ............................... 250/203.1, 203.3, 203.4
See application file for complete search history.

(56) References Cited

U.S. PATENT DOCUMENTS

| | | | | |
|---|---|---|---|---|
| 5,324,929 | A | * | 6/1994 | Yamada ................. G01D 5/165 250/214.1 |
| 5,602,384 | A | * | 2/1997 | Nunogaki ............ B60H 1/0075 126/573 |
| 6,175,413 | B1 | | 1/2001 | Lucas |
| 6,256,016 | B1 | | 7/2001 | Piot et al. |
| 2002/0126361 | A1 | | 9/2002 | Vilnrotter et al. |

OTHER PUBLICATIONS

International Application Serial No. PCT/AU2015/050769, International Search Report dated Mar. 10, 2016, 3 pgs.
International Application Serial No. PCT/AU2015/050769, Written Opinion dated Mar. 10, 2016, 7 pgs.

\* cited by examiner

MULTI-DIRECTIONAL OPTICAL RECEIVER

CROSS-REFERENCE TO RELATED APPLICATIONS

This application is the National Stage of International Application No. PCT/AU2015/050769, filed Dec. 4, 2015, which claims priority from Australian Patent Application No. 2014904921, filed Dec. 5, 2014, the disclosures of each of which are incorporated herein by reference in their entireties.

FIELD OF THE INVENTION

The present invention relates to free-space optical systems, and more particularly, though not exclusively, to receivers suitable for use in visible and/or line-of-sight positioning and communications systems.

BACKGROUND TO THE INVENTION

In many applications it is important to be able to distinguish between light transmitted from different sources at receivers. In visible light positioning (VLP) this can be used to determine the direction of one or more light sources and so determine the position of the receiver. In visible light communication (VLC) or optical wireless communication (OWC) systems, different light sources may be transmitting different data streams and the receiver must be able to separate out these streams so that the data in each stream can be recovered.

To consider one particular scenario, by way of example, energy efficient light emitting diode (LED) based lighting is rapidly replacing conventional forms of interior lighting and as a result OWC using these LEDs as data transmitters is emerging as a promising method of indoor high speed wireless communication. Advantages of such arrangements include: simultaneous illumination and communication; no interference with existing RF systems; no licensing requirements; and very high signal to noise ratio (SNR).

In typical indoor scenarios, in order to provide adequate illumination throughout the room, LED lights are located at intervals on the ceiling. This provides an opportunity to use these lights as transmitters in a multiple input multiple output (MIMO) communication system. MIMO is a well-established technology in RF communications where it can provide multiplexing gains which increase the overall data rate.

However, many of the MIMO techniques developed for RF cannot be directly applied to OWC. In particular, unlike RF, the power of the received signal in OWC systems normally varies slowly with the position of the receiver. Thus, where a number of receivers are arranged in close proximity (as in a compact device) the received signal intensities from a given transmitter are very similar. Consequently, in OWC MIMO systems using spatially separated sources, the channel matrix has similar elements, and is therefore deficient, or nearly so. Common linear solution algorithms, including zero forcing and minimum mean square error, exhibit very poor performance in such cases. This prevents the transmitted signals from being decoupled in the receiver with acceptable output signal to noise ratios (SNRs), which degrades the system performance significantly.

One technique that has been explored in efforts to meet these requirements is to use a lens, or a configuration of multiple lenses, to separate light from different directions (i.e. directional, rather than spatial, diversity of receivers). Disadvantages of such arrangements include that they tend to be bulky and/or give insufficient separation of signals from different directions and/or have a small field of view.

In all of these applications, the receivers are normally integrated in portable handheld devices, e.g. smart phones, distributed within a given indoor scenario.

Taking into account all of the above considerations, it is desirable to provide a receiver having a large field of view such that light signals can be received at any receiver position, which has improved capability to distinguish signals originating from spatially distinct sources, and which is able to achieve these objectives within a compact structure. The present invention seeks to address these requirements.

SUMMARY OF THE INVENTION

In one aspect, the invention provides an optical receiver comprising:

an opaque layer disposed on a first surface and having an aperture formed therein; and an optical detector having a detection region disposed on a second surface, wherein the first and second surfaces are spaced apart from one another such that light passing through the aperture illuminates a corresponding illumination region on the second surface, to be detected by the optical detector in the event that the detection region overlaps the illumination region.

Advantageously, the aperture forms a 'window' via which light emitted from an external source will illuminate a region on the second surface. There will, accordingly, be a specific volume of external space for which a corresponding illumination region will overlap with the detection region, such that light emitted within this volume will be detected by the optical detector. Embodiments of the invention are thereby able to detect, and distinguish, optical signals based upon their direction of origin over a large field of view, and without a requirement for complex, bulky and/or limited arrangements of lenses. Furthermore, it may be possible in practice to achieve improved separation of signals originating from spatially distinct sources based upon angle/direction of arrival, as compared with prior art arrangements based on the use of lenses and other diffractive structures, sufficient to provide the basis for a robust OWC MIMO communication system.

Unless the context requires otherwise, the word 'surface' when used in this specification may refer to a physical surface (e.g. of a layer or other structure comprising the optical receiver), or to a geometrical surface (i.e. a two-dimensional topological manifold within three-dimensional space). In either case, surfaces embodying the invention may be planar surfaces, or they may be curved surfaces.

Furthermore, in the context of the present invention the term 'aperture' refers to an opening, window, or similar structure, which is substantially transparent to transmitted optical signals, and which has dimensions substantially greater than the wavelength of the detected light. 'Substantially transparent' requires, in practice, that any attenuation of the signal which occurs during passage through the aperture is negligible in that it does not significantly impair the ability of the detector to detect the signal. The dimensions of the aperture should be sufficiently greater than the wavelength of the light such that the boundary of the illumination region corresponds spatially with the boundary of the aperture, i.e. that the effects of diffraction can be neglected in determining overlap between the illumination region and the detection region.

In embodiments of the invention, the optical receiver comprises a substrate upon which the optical detector is disposed. More particularly, the receiver may be a self-contained unit in which at least one optical detector is disposed on the substrate, which may also support further material layers, side wall, and/or other structures incorporating the opaque layer.

In some embodiments, the opaque layer comprises an opaque covering layer, the aperture being formed, e.g. as a cut-out portion, in the covering layer.

In other embodiments, the opaque layer comprises an opacifying coating disposed on a surface of a transparent covering layer, the aperture being formed in the opacifying coating.

According to some embodiments, the optical receiver further comprises a spacing layer or volume between the transparent covering layer and the second surface. The spacing layer may be an air gap.

In some embodiments, the optical receiver comprises:
a substrate, upon which the optical detector is disposed;
a transparent coating layer applied over the substrate and the optical detector; and
an opacifying coating applied over the transparent coating, the aperture being formed in the opacifying coating.

Advantageously, such embodiments comprise substantially solid structures, and may therefore provide greater robustness and protection for the optical detector and other components.

The receiver may comprise a plurality of apertures formed in the opaque layer and/or a plurality of optical detectors. Such embodiments may be multi-directional, and allow signals to be received, and distinguished, which originate from spatially distinct sources.

The first surface may comprise a first plane, and the second surface may comprise a second plane, i.e. embodiments of the invention may employ apertures and optical detectors in parallel arrangements.

In another aspect, the invention provides a method for directional detection of light emitted from an optical source, the method comprising:
passing the light emitted from the optical source through an aperture formed in an opaque layer disposed on a first surface;
projecting the light via the aperture onto a corresponding illumination region of a second surface; and
detecting the projected light in the event that the illumination region overlaps a detection region defined on the second surface.

According to embodiments of the invention, the detection region is defined by a light-sensitive area of an optical detector.

Further aspects, features and advantages of the invention will be apparent from the following description of particular embodiments, which are provided by way of example in order to illustrate the principles of the invention, but which should not be understood as limiting the scope of the invention as disclosed in the preceding statements, or as defined in the claims appended hereto.

BRIEF DESCRIPTION OF THE DRAWINGS

Embodiments of the invention will now be described with reference to the accompanying drawings, in which like reference numerals refer to like features, and wherein.

DETAILED DESCRIPTION OF EMBODIMENTS

Figure 1:
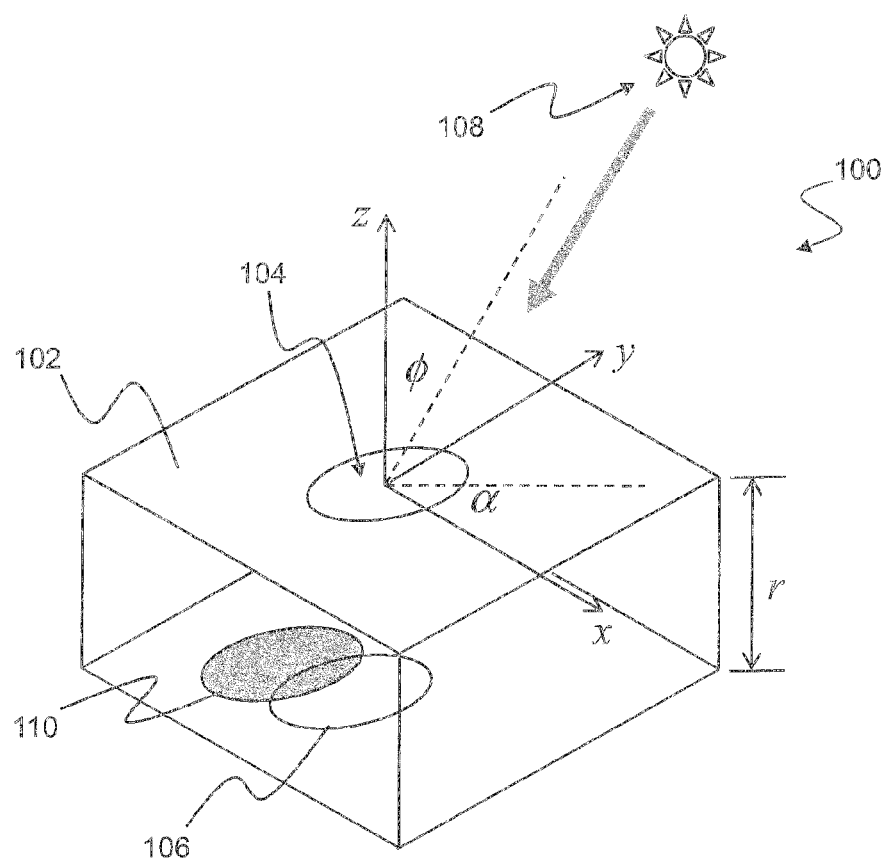
FIG. 1 is a schematic diagram of a receiver arrangement embodying the invention.

FIG. 1 is a schematic diagram of a receiver arrangement 100 embodying the invention. The receiver 100 comprises an opaque layer 102 disposed on a first surface. An aperture 104 is formed in the opaque layer 102. The opaque layer 102 may be an opaque covering layer, with the aperture 104 being formed as a gap or hole within the covering layer. Alternatively, the opaque layer may comprise an opacifying coating disposed on a surface of a transparent covering layer, with the aperture being formed in the opacifying coating, for example by printing, etching, or some other suitable means.

An optical detector 106, such as a semiconductor photo-detector, is disposed on a second surface, i.e. beneath the opaque layer 102 in the orientation shown in FIG. 1. The detector 106 has a detection region which is sensitive to incident light, such as that transmitted from light source 108.

The first surface, corresponding with the opaque layer 102, and the second surface, on which the detection region of the detector 106 is disposed, are spaced apart from one another such that light passing through the aperture 104 illuminates a corresponding illumination region 110 on the second surface. To the extent that the illumination region 110 overlaps the detection region of the optical detector 106, the detector 106 may detect the presence of light, for example by the generation of photocurrent within a semiconductor photodetector.

Figure 2:
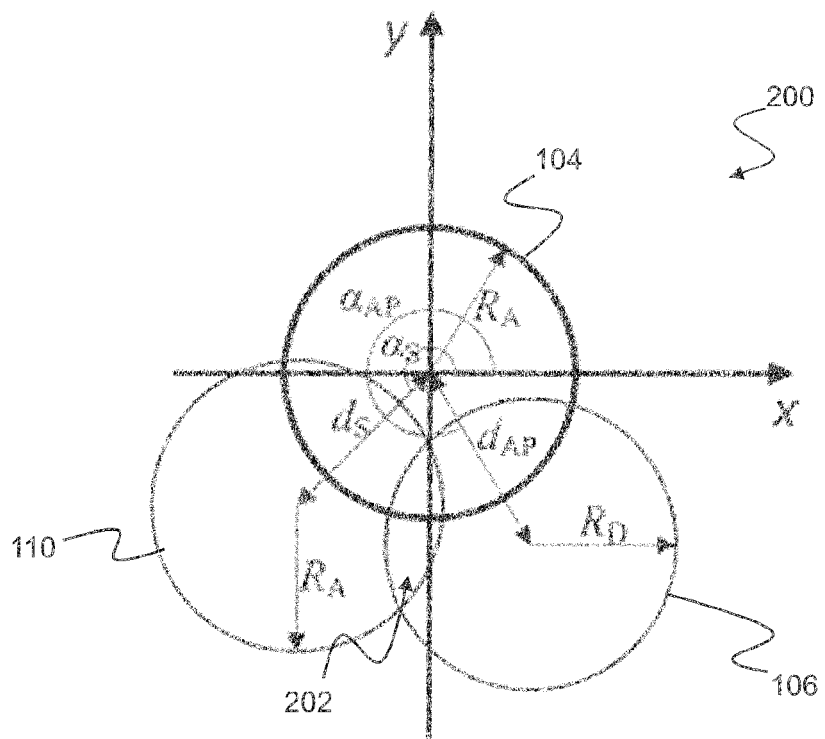
FIG. 2 is a plan view of the arrangement of FIG. 1.

FIG. 2 is a plan view 200 of the arrangement of FIG. 1. A number of dimensions and angles are indicated, by way of example, in FIGS. 1 and 2. These correspond with an exemplary arrangement in which the following design choices and assumptions are employed:
the aperture 104 is circular, having a radius $R_A$;
the photodetector 106 is also circular, having a corresponding detection region occupying its entire upper-surface of radius $R_D$;
incident light 108 is emitted from an optical source having an angle of incidence $\phi$, measured from the zenith, and a polar angle $\alpha$, measured relative to a coordinate system in the plane of the second surface, as shown in FIGS. 1 and 2;
the first and second surfaces are assumed to be planar, and separated by a constant distance r; and
the distance from the light source to the first surface is assumed to be much greater than the distance r separating the first and second surfaces, such that light rays passing through the aperture 104, may be assumed to be parallel, such that the illumination region 110 is also circular, with radius $R_A$.

As will be appreciated, these design choices and assumptions are made for the purpose of explaining the principles of the invention, and are not intended to be limiting. For example, the aperture 104 may be of any convenient, suitable or desired shape. Similarly, the photodetector 106 may be of a different size and shape, depending upon design requirements and/or manufacturing constraints. The first and second surfaces need not be planar, nor need they be parallel and equidistant from one another, and may comprise any suitable two-dimensional topological manifolds within three-dimensional space.

Turning to the plan view 200 in FIG. 2, the position of the photodetector 106 relative to the aperture 104 is given by the vector joining their central points, having length $d_{AP}$, and polar angle $\alpha_{AP}$. As will be appreciated, this displacement is determined in accordance with design requirements of the receiver 100.

Using the same coordinate system, the displacement of the centre of the illuminated region 110 is described by the distance $d_s$ and angle $\alpha_s$. This displacement depends upon the location of the light source, according to the following equation:

$$(d_s, \alpha_s) = (r \tan \phi, \pi + \alpha)$$

The illuminated region 110 is thus diagonally opposite the light source, and the radial distance $d_s$ is a function of the spacing r and the angle of incidence $\phi$.

The overlap 202 between the illumination region 110 and the photodetector 106 has area A.

In the case of an ideal isotropic light source, a detected optical signal will reach a maximum if/when there is complete overlap between the illumination region 110 and the detection region 106. This will occur for the following values of the angle of incidence and polar angle, denoted by $\alpha_{max}$ and $\phi_{max}$.

$$\alpha_{max} = \alpha_{ap} - \pi$$

$$\phi_{max} = \arctan \frac{d_{ap}}{r}$$

It will therefore be appreciated that the relative locations of the aperture 104 and the photodetector 106 can be designed in order to provide for selective detection of light emitted from one or more sources arriving at the receiver 100 from different directions, originating at some distance above the receiver 100. In an exemplary application, the light sources may be LEDs fixed to the ceiling of a room or other space, and which may be modulated to carry a signal usable by a device associated with the receiver 100 for purposes of positioning and/or communications.

In such practical scenarios, the light sources cannot be assumed to be isotropic. In particular, LED light sources are generally fitted with downward-facing lenses, which determine the 'spread' of emitted light. This spread can generally be approximated as being Lambertian, having an order m which depends upon the lens design. Generally, higher values of the order m correspond with a tighter focus of emitted light. In this case, for a receiver 100 positioned at a distance l from an emitting LED light source, the channel gain between the LED and the photodetector 106 is given by:

$$h_c = \frac{(m+1)A}{2\pi l^2} \cos^{m+1} \phi$$

Figure 3:
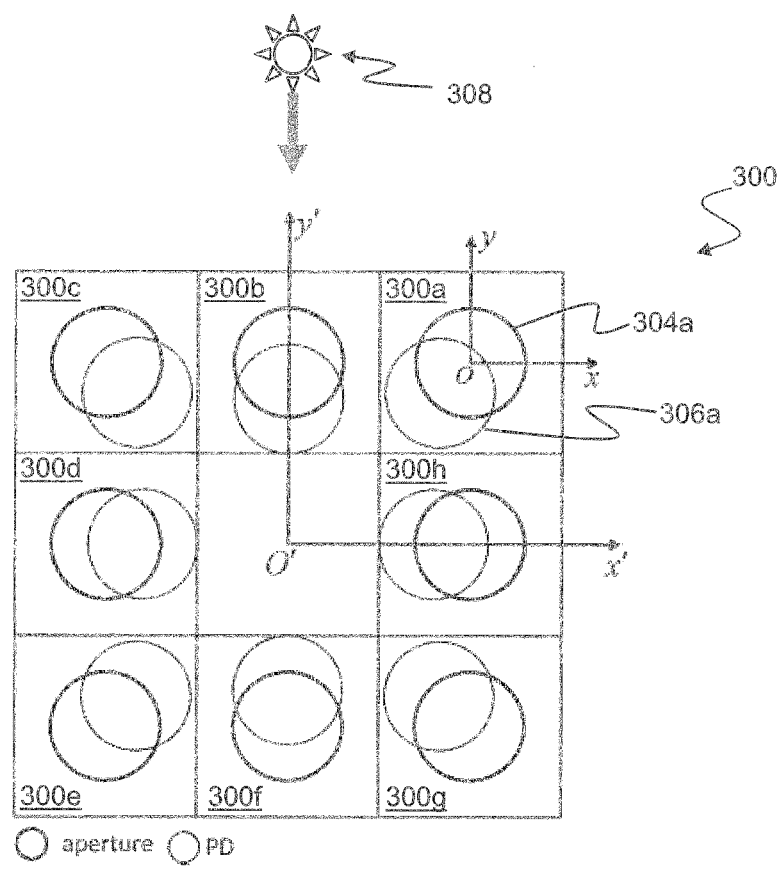
FIG. 3 is a plan view illustrating an optical receiver comprising eight receiving elements embodying the invention.

FIG. 3 shows a plan view illustrating an optical receiver 300 comprising eight receiving elements (REs). These eight REs are denoted by reference numerals 300a to 300h. Each RE comprises an aperture, e.g. 304a, and a corresponding optical detector having a detection region, e.g. 306a. The location of the detection region relative to the aperture is different in each case, such that each RE has a different directional sensitivity. For example, considering a light source 308 positioned above the receiver 300, and relative to its centre as indicated in the drawing, the RE 300b will generate the strongest received signal. That is, light entering the aperture of RE 300b from the light source 308 results in a maximum overlap, out of all REs, between the detection region 306b and corresponding illumination region generated by the light passing through the aperture 304b.

The capacity of a receiver embodying the invention, such as the eight-RE receiver 300, to distinguish signals originating from spatially distinct sources may be determined by selection of the number and position of REs, and the size and relative locations of the aperture and detection region of each RE. In contrast with lens-based arrangements, receivers embodying the present invention can provide suppression of light from different directions, without significant increases in size or complexity of the receiver. The REs rely on masking effects, rather than refractive or diffractive effects, as in lenses and other arrangements, and each RE can be made substantially independent of all others, to provide a wide-field view within which signals from different directions can be well-separated.

Receivers embodying the invention may be fabricated in a number of different ways, with details of the resulting structure depending upon the manufacturing choices. Three examples are illustrated schematically, in cross-sectional view, in FIGS. 4(a), 4(b) and 4(c).

Figure 4A:
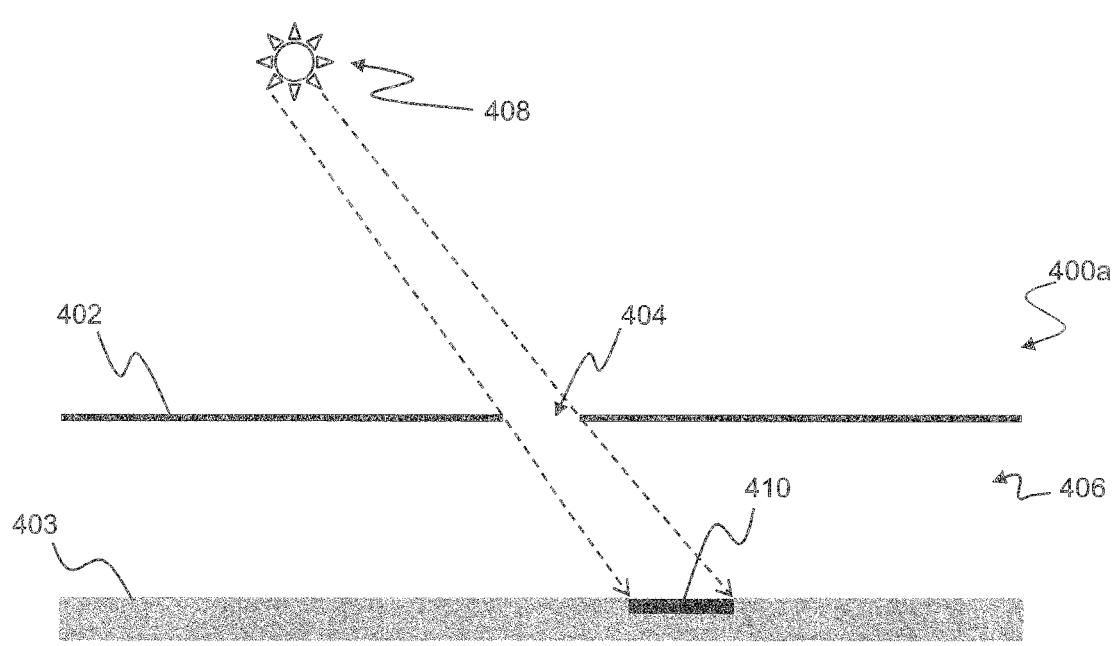
FIG. 4 shows schematic illustrations of cross-sectional views of three alternative structures embodying the invention.

FIG. 4(a) illustrates a structure 400a corresponding generally with the exemplary embodiment shown in FIG. 1. An opaque covering layer 402, comprising a thin layer of an opaque material, such as a metallic, plastic or ceramic material, is disposed along a first surface, which is separated from a substrate 403 by an air gap 406. The substrate 403 may be any suitable material, or combination of materials (e.g. layers), onto or within which optical detectors, such as semiconductor photodetectors, may be fixed or fabricated. An aperture 404 comprises a hole or gap in the opaque layer 402, through which light emitted from a source 408 passes to form an illumination region 410.

Figure 4B:
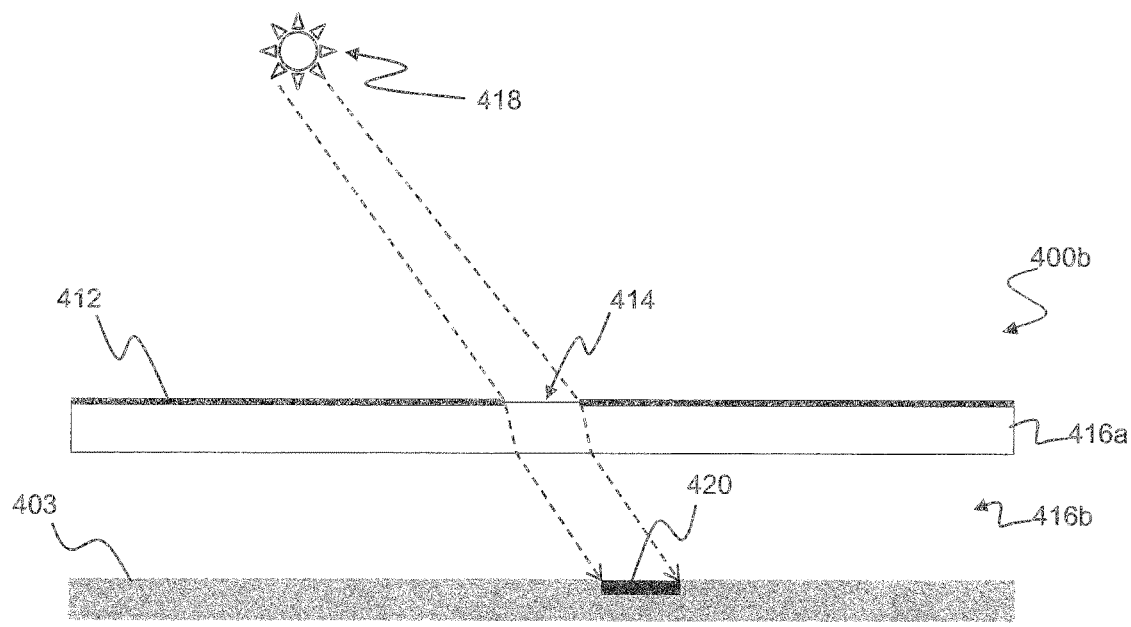

An alternative embodiment 400b is illustrated in FIG. 4(b). In the embodiment 400b an opacifying layer 412 is formed (e.g. by printing, painting or deposition) on a thin transparent layer 416a. The transparent layer 416a may be, for example, silica glass, sapphire, diamond, or other suitable transparent material. An aperture 414 is formed in the opacifying layer 412, for example by omitting opacifying material when forming the layer, or by subsequently etching opacifying material away in the location of the desired aperture 414.

Light from source 418 passes through the aperture 414, and then through the transparent layer 416a, before crossing an air gap 416b to form an illuminated region 420. The passage of the light in the embodiment 400b differs from the embodiment 400a in that refraction occurs at the interfaces of the transparent layer 416a with the air located above and below the layer. As shown, this results in a small shift in the location of the illumination region 420. This shift depends upon the refractive index and thickness of the transparent layer 416a, and can be readily accounted for in design of a receiver, since the refraction simply obeys Snell's law at the boundaries.

Figure 4C:
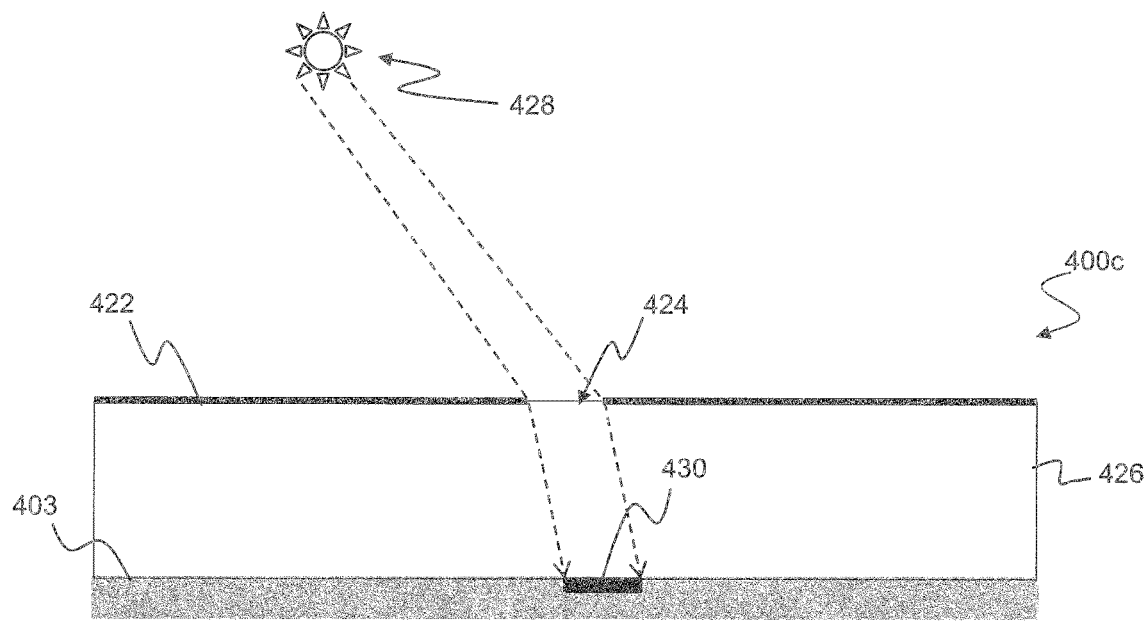

A further embodiment 400c is illustrated in FIG. 4(c). According to this embodiment, a transparent layer 426 is bonded or formed directly on the surface of the substrate 403, such that there is no air gap between the transparent layer 426 and the substrate 403. As in the embodiment 400b, an opacifying layer 422 is formed on the surface of the transparent layer 426. An aperture 424 is formed within the opacifying coating 422. Light from a source 428 passes through the aperture 424, and into the transparent layer 426, through which it passes to form an illumination region 430. As in the embodiment 400b, refraction at the interface between the air above the aperture 424, and the transparent layer 426 results in a shift in the location of the illumination region 430 which is entirely determined by the refractive index and thickness of the transparent layer 426, and the application of Snell's law. This shift can therefore be accounted for in the design of a receiver having the structure 400c illustrated in FIG. 4(c).

While three basic structures are illustrated in FIG. 4, it will be appreciated that other structures are also possible, and fall within the scope of the present invention. For example, additional transparent layers could be formed either above or below the opaque layer or opacifying coating. Such layers could be provided, for example, in order to improve the strength of the receiver, or to provide additional protection for the photodetectors and other electronics disposed in or below the substrate 403. Multiple transparent layers, having different refractive indices, may be employed in order to provide additional optical functionality and/or benefits. For example, multiple layers may be used to form anti-reflection coatings, or to provide for selective passage of light at predetermined wavelengths.

While exemplary embodiments have been described, in order to illustrate the principles of the invention, a number of variations will be apparent to persons skilled in the art of optical design, and such variations are also within the scope of the invention. In particular, the exemplary embodiments described above are not intended to be limiting of the invention, the scope of which is as defined in the claims appended hereto.

The invention claimed is:

1. An optical receiver adapted to receive and separate modulated optical communications signals from multiple optical communications sources, comprising:
   an opaque layer disposed on a first surface and having an aperture formed therein; and
   an optical detector having a plurality of detection regions disposed on a second surface,
   wherein the first and second surfaces are spaced apart from one another such that modulated optical communications signals passing through the aperture illuminate corresponding illumination regions on the second surface, to be detected by the optical detector in the event that one or more of the plurality of detection regions overlaps one or more of the corresponding illumination regions.

2. The optical receiver of claim 1 which further comprises a substrate upon which the optical detector is disposed.

3. The optical receiver of claim 1 wherein the opaque layer comprises an opaque covering layer, the aperture being formed in the covering layer.

4. The optical receiver of claim 1 wherein the opaque layer comprises an opacifying coating disposed on a surface of a transparent covering layer, the aperture being formed in the opacifying coating.

5. The optical receiver of claim 4 which further comprises a spacing layer or volume between the transparent covering layer and the second surface.

6. The optical receiver of claim 5 wherein the spacing layer is an air gap.

7. The optical receiver of claim 1 which comprises:
   a substrate, upon which the optical detector is disposed;
   a transparent coating layer applied over the substrate and the optical detector; and
   an opacifying coating applied over the transparent coating, the aperture being formed in the opacifying coating.

8. The optical receiver of claim 1 which comprises a plurality of apertures formed in the opaque layer.

9. The optical receiver of claim 1 wherein the optical detector comprises a plurality of optical detectors.

10. The optical receiver of claim 1 wherein the first surface comprises a first plane.

11. The optical receiver of claim 1 wherein the second surface comprises a second plane.

12. A method for receiving and separating modulated optical communications signals from multiple optical communications sources, the method comprising:
    passing the modulated optical communications signals emitted from the multiple optical communications sources through an aperture formed in an opaque layer disposed on a first surface;
    projecting the modulated optical communications signals via the aperture onto corresponding illumination regions of a second surface spaced apart from the first surface; and
    detecting respective projected modulated optical communications signals in the event that one or more of the corresponding illumination regions overlaps one or more of a plurality of detection regions defined on the second surface.

13. The method of claim 12 wherein the detection regions are defined by one or more light-sensitive areas of an optical detector.

14. An optical communications system comprising:
    a plurality of optical sources that output modulated optical communications signals; and
    an optical receiver adapted to receive and separate modulated optical communications signals from the plurality of optical sources, the optical receiver comprising:
    an opaque layer disposed on a first surface and having an aperture formed therein, and
    an optical detector having a plurality of detection regions disposed on a second surface,
    wherein the first and second surfaces are spaced apart from one another such that modulated optical communications signals from the plurality of optical sources passing through the aperture illuminate corresponding illumination regions on the second surface, to be detected by the optical detector in the event that one or more of the plurality of detection regions overlaps one or more of the corresponding illumination regions.

15. A system as in claim 14, wherein the plurality of optical sources comprise LED transmitters that emit modulated optical signals.

* * * * *